United States Patent [19]

Pogge et al.

[11] 3,919,060

[45] Nov. 11, 1975

[54] METHOD OF FABRICATING SEMICONDUCTOR DEVICE EMBODYING DIELECTRIC ISOLATION

[75] Inventors: H. Bernhard Pogge, Hopewell Junction; Michael R. Poponiak, Newburgh, both of N.Y.

[73] Assignee: International Business Machines Corporation, Armonk, N.Y.

[22] Filed: June 14, 1974

[21] Appl. No.: 479,321

[52] U.S. Cl. .... 204/129.3; 204/129.65; 204/129.75

[51] Int. Cl.[2] .......... C25F 3/00

[58] Field of Search .......... 204/129.3, 129.65, 32 S, 204/129.1, 129.75

[56] References Cited

UNITED STATES PATENTS

| | | | |
|---|---|---|---|
| 3,386,865 | 6/1968 | Doo | 148/175 |
| 3,640,806 | 2/1972 | Watanabe et al. | 204/32 S |
| 3,648,125 | 3/1972 | Peltzer | 317/235 |
| 3,661,741 | 5/1972 | Meek | 204/129.3 |

FOREIGN PATENTS OR APPLICATIONS

| | | |
|---|---|---|
| 102,988 | 12/1973 | Japan |

OTHER PUBLICATIONS

IBM Technical Disclosure Bulletin, Vol. 15, No. 2, July 1972, page 682.

*Primary Examiner*—T. M. Tufariello
*Attorney, Agent, or Firm*—Wolmar J. Stoffel

[57] ABSTRACT

A semiconductor fabrication method for producing dielectrically isolated silicon regions wherein high conductivity regions surrounding device regions to be electrically isolated are produced in a silicon body, the high conductivity regions anodically etched in a solution to selectively produce regions of porous silicon, the body exposed to an oxidizing environment while heated to an elevated temperature to oxidize the resultant porous silicon regions.

17 Claims, 14 Drawing Figures

METHOD OF FABRICATING SEMICONDUCTOR DEVICE EMBODYING DIELECTRIC ISOLATION

BACKGROUND OF THE INVENTION

This invention relates to semiconductor device fabrication methods, more particularly, methods for producing silicon oxide regions in a silicon structure capable of electrically isolating regions of the silicon body.

In semiconductor integrated circuit devices, it is essential that various active and passive elements supported on a substrate be electrically isolated, particularly when the device utilizes bipolar transistors. Various structures have been used to provide such isolation. An early isolation structure consisted of surface diffused annular regions that surrounded regions of an epitaxial layer to be isolated in combination with a lateral PN junction. The region was then isolated by backbiasing the PN junctions. However, this structure had limitations which became more serious as integrated circuit device structures became more microminiaturized. The PN junctions contributed significant capacitance to the elements in circuits of the integrated circuit devices, which placed a constraint on device performance. Also, spacing was required between the isolation junctions and the device structures which limited the degree of microminiaturization that could be achieved.

Another form of isolation known to the art was dielectric isolation. Here, annular regions of dielectric material, such as $SiO_2$, glass, etc., were formed about the regions of the device to be isolated. The bottom surfaces of the region could be either a PN junction or a layer of dielectric material. This structure had significant advantages over junction isolation. The capacitance of the elements and circuits was less. Further, the density of the integrated circuit devices could be increased because the diffused regions of the various elements, such as transistors, diodes, etc., could be abutted against the annular dielectric regions thereby conserving space. However, such structures were relatively difficult to fabricate by the known techniques. An early technique consisted of forming a grid of channels in a silicon semiconductor wafer (with or without an epitaxial layer), forming a layer of oxide or other dielectric material on the surface of the wafer, depositing a thick backing layer of polycrystalline silicon, and subsequently removing by one of several available techniques the main body of the silicon wafer. This left a plurality of insulated silicon regions supported in a polysilicon supporting base. Various elements could then be fabricated in the monocrystalline silicon regions. However, the substrate removal operation was tedious, time consuming, and difficult. Another isolation technique is disclosed in U.S. Pat. No. 3,386,865 which resulted in annular oxide regions providing sidewall isolation, and a PN junction providing bottom isolation for monocrystalline silicon regions supported on a silicon substrate. The monocrystalline silicon regions are formed by selective epitaxial deposition. This technique demanded close control of processing conditions. Yet another technique is described in U.S. Pat. No. 3,648,125 where the sidewall isolation is formed by selectively thermally oxidizing annular surface regions of a silicon substrate to form recessed oxide regions. This technique necessarily subjects the device elements to a prolonged heat cycle which in certain situations is objectionable and thus limits its applications to relatively shallow depths.

The technique set forth in U.S. Pat. No. 3,640,806 materially decreased the heating time requirement for forming recessed oxide dielectric regions. The process consists of masking a silicon substrate, anodizing the substrate to form porous silicon regions in the unmasked areas, and subsequently exposing the heated substrate to an oxidizing atmosphere. The porous silicon oxidizes at a rapid rate and therefore the oxidation time is materially reduced. However, the utility of the original patented process was limited because it does not provide the desired control for confining the anodizing action for forming the porous silicon.

SUMMARY OF THE INVENTION

An object of this invention is to provide an improved method for forming oxide regions in a semiconductor suitable for use as dielectric isolation.

Another object of this invention is to provide an improved method for forming oxide regions in a semiconductor device wherein the heating cycle normally required for forming oxide regions is materially decreased.

Another object of this invention is to provide a new method for achieving total dielectrically isolated single crystalline semiconductor regions.

Yet another object of the invention is to minimize or eliminate stresses due to volume expansion during oxidation, and simultaneously maintaining a high degree of surface planarity.

These and other objects of the invention are achieved in a method of producing a semiconductor device with dielectrically isolated regions, wherein there is formed in the silicon substrate high conductivity regions, or regions of an opposite conductivity type to the substrate, that define the ultimate desired dielectric regions, anodically etching the substrate in a hydrofluoric acid solution to selectively produce regions of porous silicon structure in the high conductivity or opposite conductivity type regions, and exposing the substrate to an oxidizing environment while heated to an elevated temperature to oxidize the porous silicon regions.

DESCRIPTION OF THE PREFERRED EMBODIMENTS

While the present invention will now be disclosed in detail with reference to the illustrated method embodiments of the invention, it should be understood that the disclosure is not intended to limit the present invention to particular embodiments, but to rather cover all possible modifications, alterations in equivalent arrangements to be included in the scope of the invention as defined in the claims.

Figure 1:
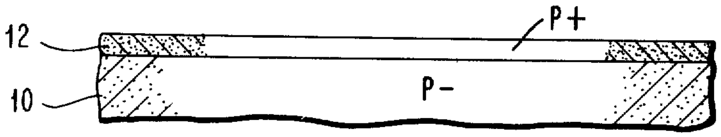
FIGS. 1–7 is a sequence of cross-sectional views in broken section that illustrates a preferred method embodiment of the invention.
Figure 2:
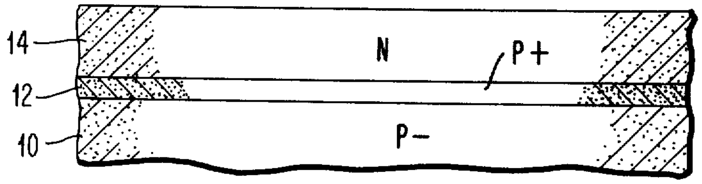

Referring now to the drawings, in particular FIGS. 1–7, there is depicted a preferred embodiment of the method of this invention wherein monocrystalline silicon regions of a substrate are completely surrounded by silicon oxide in the final structure. The first step illustrated in FIG. 1, is the forming on silicon substrate 10 of a surface high conductivity region 12. In the preferred embodiment, the monocrystalline silicon substrate 10 has a P-type background dopant with a concentration on the order of $10^{15}$ atoms/cc. Region 12 can conveniently be achieved by a blanket diffusion of a suitable P-type dopant for silicon which should be sufficient to achieve a dopant concentration level of at least three orders of magnitude higher than the base substrate. Typically, the substrate 10 has a doping on the order of $10^{15}$ atoms/cc and the region 12 has a doping on the order of $10^{18}$ to $10^{20}$ atoms/cc. Alternatively, region 12 could be produced by ion implantation, or depositing a relatively heavily doped thin epitaxial layer on substrate 10. The next step is illustrated in FIG. 2, wherein an N-type epitaxial layer 14 is deposited on the surface of substrate 10 over layer 12. The epitaxial deposition and the doping techniques are all well-known in the prior art and will therefore not be discussed in detail.

Figure 3:
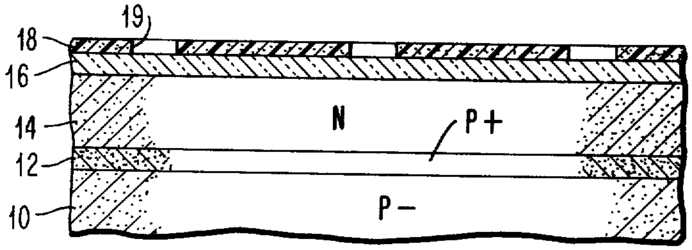
Figure 4:
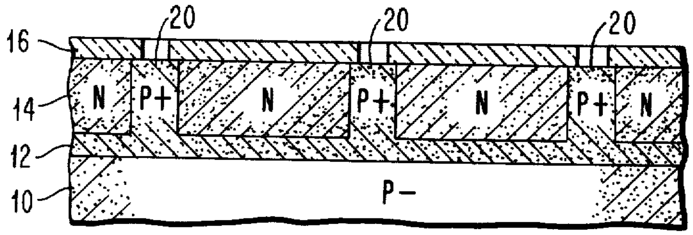

As shown in FIG. 3, a masking layer 16 is deposited or formed on the surface of layer 14. Masking layer 16 can be silicon dioxide formed by thermal oxidation, or pyrolytic deposition, or alternatively, be formed of a composite combination, as for example silicon dioxide with an overlying layer of silicon nitride, or other layer combinations thereof. A resist layer 18 is subsequently deposited on layer 16 which is exposed and developed to form the desired pattern indicated by openings 19. The pattern in resist 18 corresponds to the desired surface configuration of the vertical portions of the ultimate total oxide regions desired in the semiconductor device. As indicated in FIG. 4, the exposed portions of layer 16 are etched using a suitable etchant, and the resist layer removed. Higher conductivity regions 20 are then formed by diffusing or ion implanting P-type impurity through the openings in mask 16. Preferably, the dopant concentration in regions 20 corresponds closely to the maximum dopant concentration in layer 12 which was described previously. Although not shown in FIGS. 1–4, high conductivity regions can be formed into the semiconductor structure to serve as subcollectors if necessary or desirable. This structure can be formed by any appropriate processing sequence, as for example, ion implantation or multiple epitaxial layers with an intermediate diffused region. Further, the conductivity types of the various regions disclosed can be of the opposite type.

Figure 5:
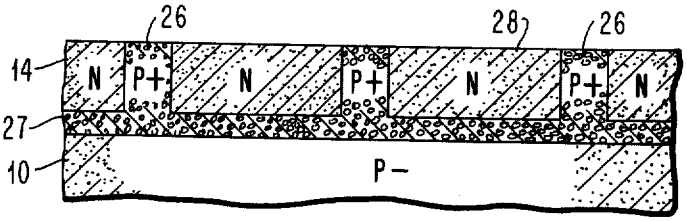
Figure 14:
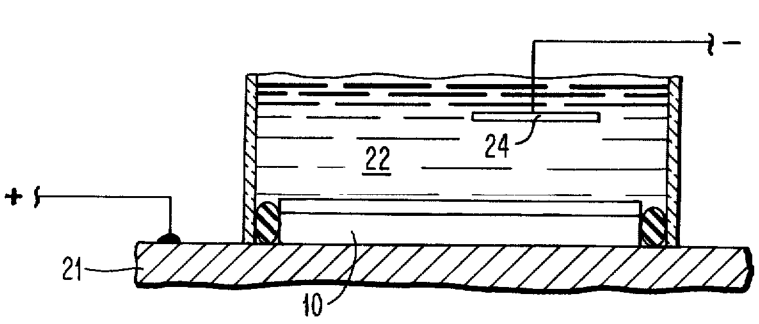
FIG. 14 is an elevational view in broken section of an apparatus for anodizing the silicon wafer regions.

The high conductivity regions 20 and 12 are then anodized in a solution which converts the silicon in the regions to a porous silicon structure. This can be conveniently achieved by anodizing the structure in an aqueous HF solution at a current density sufficient to achieve porosity. In general, the anodizing solution should contain HF in an amount greater than ten percent, more particularly from 12 to 25 percent. The most desirable solution concentration for a specific application will depend on device configuration, dopant concentration, solution temperature, current density, illumination, etc. The substrate 10 is made the anode in an HF solution 22 through contact 21 as shown in FIG. 14. A suitable plate 24 acts as the cathode. After the anodization step illustrated in FIG. 5 is complete, the average porosity of the porous silicon should be greater than 40 percent, more preferably in the range of 50 to 80 percent. Most preferably, the porosity is on the order of 56 percent. This porosity will result in dense $SiO_2$, after oxidation, without introducing significant internal stresses. The exact porosity of the silicon can be adjusted by varying the HF concentration of the anodizing solution, the illumination, the temperature of the solution, the dopant concentration of the silicon regions, and the current density. If the silicon porosity is significantly greater than 56 percent, a porous $SiO_2$ is obtained. If the porosity is significantly less than 56 percent, stressed silicon may result due to the volume expansion resulting from silicon being oxidized to $SiO_2$. The current density for ordinary, practical conditions is in the range of 20 to 60 milliamperes per square cm.

As illustrated in FIG. 5, porous silicon region 26 can be formed on the sidewall of monocrystalline region 28, and region 27 on the bottom, thereby completely encircling the region 28. When sub-collector regions are formed in monocrystalline regions 28 which are opposite in type to the layer 12 and region 20, typically N-type regions, the P-type regions 12 and 20 are preferentially etched leaving the sub-collector N+ regions. In utilizing the structure illustrated in FIGS. 1–5, a silicon oxide masking layer 16 can be used. In the anodizing process, the masking layer 16 will be etched away. In the illustrated method embodiment, no masking layer is required during the anodizing step since the P+ regions 12 and 20 are preferentially attached over regions 28. If a material such as silicon nitride is used as a diffusion mask that is resistant to an HF solution, the material will remain during anodization. This type of masking layer is desirable when the conductivity types of the substrate are reversed, i.e., N+ annular regions surrounding P-type monocrystalline device regions.

Figure 6:
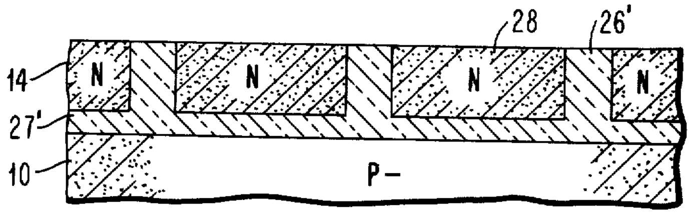

The porous regions 26 and 27 are oxidized in an oxidizing environment, typically in $0_2$ or steam, at elevated temperatures. The porous regions 26 and 27 will oxidize very rapidly, compared to monocrystalline silicon. The usual oxidation masking layer, typically $Si_3N_4$, is not necessary because the steam or $0_2$ penetrates the porous silicon regions. The porous silicon is converted to $Si0_2$ before a significant $Si0_2$ layer is formed on the surface. The structure after oxidation is illustrated in FIG. 6 of the drawings, wherein $Si0_2$ regions 26′ and 27′ completely isolate regions 28.

Figure 7:
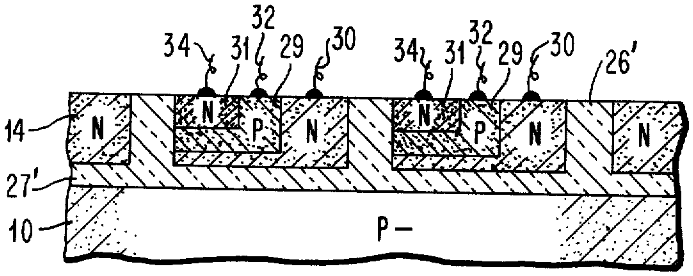

As illustrated in FIG. 7, transistor devices can be formed in monocrystalline regions 28. Base and emitter regions 29 and 31, respectively, can be formed by conventional diffusion techniques. Alternately, the regions could be formed by ion implantation. Contacts 30, 32 and 34 to collector, base and emitter regions are formed by conventional techniques. It is obvious that other types of semiconductor devices, such as field effect transistors, resistors, complementary transistor FET's, complementary bi-polar transistors and combinations thereof, Schottky barrier diodes, and the like, could be formed in the isolated regions 28 of monocrystalline material.

Figure 8:
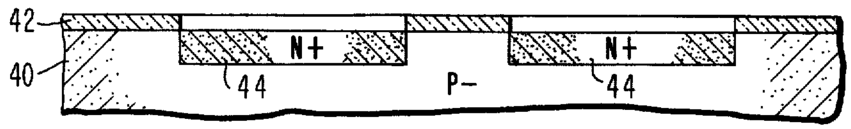
FIGS. 8–13 is a second sequence of crosssectional views that illustrates yet another preferred specific embodiment of the method of the invention.
Figure 9:
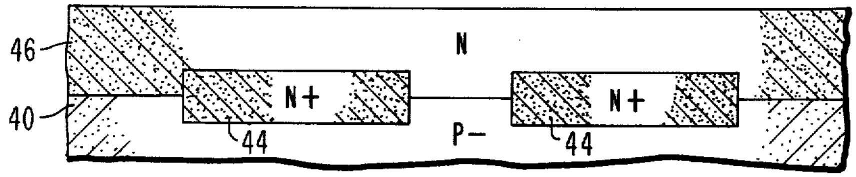
Figure 10:
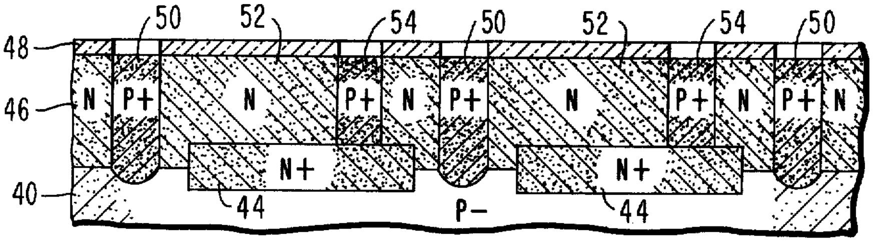
Figure 11:
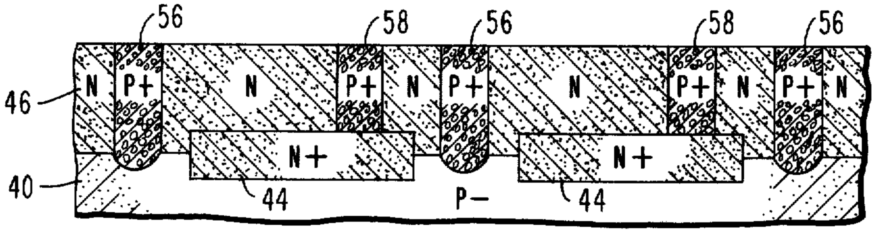
Figure 12:
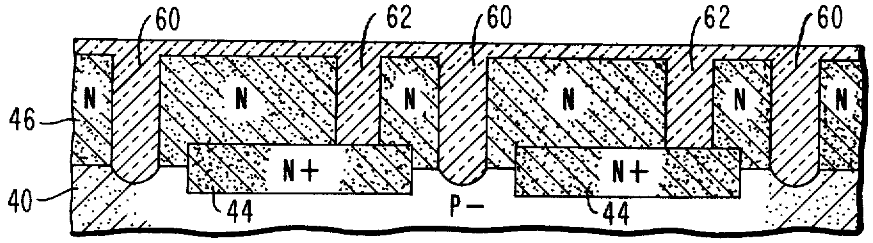
Figure 13:
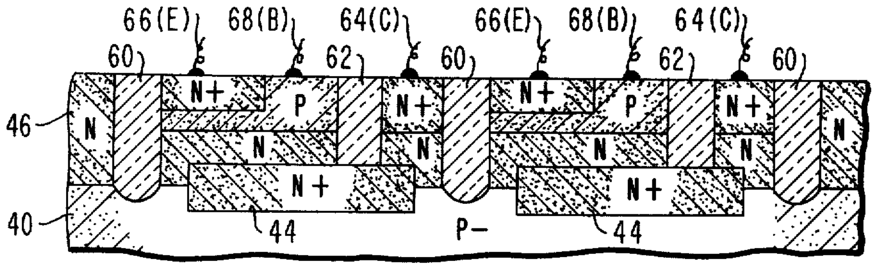

Referring now to FIGS. 8–12, there is depicted another preferred embodiment of the method of this invention. As indicated in FIG. 8, silicon substrate 40 is masked with layer 42 and a diffusion made forming high conductivity N-type doped regions 44. The masking layer 42 is removed and an epitaxial silicon layer 46 deposited on the top surface of substrate 40. As indicated in FIG. 10, a masking layer 48 is deposited on the surface of epitaxial layer 46 and a pattern etched therein using conventional photolithographic and etching techniques to define a grid of openings that will overly the ultimate desired recessed oxide regions. A conventional diffusion or ion implantation step results in a grid of high conductivity P-type regions 50 that surround monocrystalline regions of the epitaxial layer 46. In the preferred specific embodiment, the monocrystalline silicon N-type region 52 surrounded by P-type region 50, and is divided into two portions by an intermediate P-type region 54. Region 54 extends to the high conductivity region 44. Regions 50 extend down to the interface between the epitaxial layer 46 and substrate 40 or to a generally laterally extending PN junction. If desired, regions 50 can extend into the structure to contact the PN junction surrounding region 44. The resultant substrate is then exposed to an anodizing step, described previously in relation to FIG. 5 wherein the silicon of regions 50 and 54 is converted to porous silicon, preferably having a porosity on the order of 56 percent. The porous silicon regions 56 surround the monocrystalline pockets of the epitaxial layer above high conductivity N-type region 44 while intermediate porous silicon region 58 separates the surrounded pocket into two regions. As indicated in FIG. 12, the porous silicon in regions 56 and 58 is then oxidized to form corresponding oxide regions 60 and 62. The oxidation is similar to that described in relation to FIG. 6 of the drawings. Various types of semiconductor devices, both active and passive can then be formed by any suitable semiconductor processing technique into the isolated pockets of monocrystalline epitaxial layer 46. As indicated in FIG. 13, a transistor can be formed wherein a collector contact 64 is formed in one of the regions. Emitter and base regions 66 and 68, respectively, are fabricated by diffusion or ion implantation techniques. The transistor can be passivated using conventional well-known passivation techniques and interconnection metallurgy systems to interconnect the transistors and other devices into operative circuit elements.

The following Examples illustrate a preferred embodiment of the methods of the invention and should not be construed to unduly limit the scope of the invention.

EXAMPLE I

A silicon wafer having a background doping concentration of $10^{15}$ atoms/cc of boron was selected. A capsule boron diffusion was made that produced a blanket surface diffusion having a surface concentration of $10^{20}$ atoms/cc with a junction depth of 0.5 microns. An epitaxial silicon layer with an arsenic doping level of $10^{16}$ atoms/cc was deposited, having a thickness of 2 microns, using conventional deposition techniques, and subsequently oxidized to form an $SiO_2$ surface layer of a thickness on the order of 1600 Angstroms. A photoresist layer was deposited, exposed to form a surface grid pattern, and developed. The exposed underlying $SiO_2$ layer was etched away exposing the underlying silicon. After the resist layer was removed, the silicon wafer was subjected to a boron capsule diffusion which produced a grid diffusion configuration to a depth of 2 microns having a surface boron concentration similar to the aforementioned blanket surface diffusion. The resultant wafer was anodized in a twelve percent aqueous HF solution at room temperature for 20 minutes at a current density of 30 milliamperes per square cm. of active area, i.e., the area of the grid configuration diffusion. The wafer was made the anode. This step produced a porous silicon structure to be formed within the grid configuration diffusion, and also the buried blanket diffused region. Weight change measurements were made which indicated a porosity of 56 percent. The wafer was then heated for 30 minutes at 970°C in a steam environment. This formed a 1600 Angstrom layer of $SiO_2$ on the surface and also converted the porous silicon regions to $SiO_2$ regions.

EXAMPLE II

The wafer produced in Example I was subjected to a breakdown voltage test to determine the insulative effectiveness of the $SiO_2$ regions. After the surface layer of oxide was removed from the epitaxial regions, two probes were placed on adjacent regions of the epitaxial layer that made electrical contact to the regions. A voltage potential was applied across the probes which was increased monitoring the current flow. The procedure was repeated for different pairs of regions and the results of the tests recorded and averaged. It was noted that typical voltage breakdowns occurred at 600 volts which was indicated by an abrupt current surge. Until the 600 volt value was reached, there was no appreciable measurable current flow. This provides a positive indication that the oxide regions provide effective electrical isolation.

EXAMPLE III

The wafer fabricated in Example I was beveled at an angle of 2° to expose the vertical profile of the internal structure of the wafer. A visual inspection indicated that the $SiO_2$ regions were uniform and continuous. The quality of the $SiO_2$ regions was checked at various levels by contacting the region with the probe of a spreading resistance measurement apparatus described and claimed in U.S. Pat. No. 3,590,372. The average spreading resistance reading was greater than $10^{12}$ ohms. The reading for good quality $SiO_2$ is also in excess of $10^{12}$ ohms. This indicates that the $SiO_2$ regions of the device are of good quality $SiO_2$ for isolation purposes.

EXAMPLE IV

The wafer fabricated in Example I and beveled in Example III was placed under a optical microscope and exposed to white light. Clear and distinct interference fringes were observed in the oxidized regions indicating that the porous silicon was converted to silicon oxide. An earlier section of unoxidized porous silicon did not exhibit the interference fringes. Infrared transmission spectra data after oxidation of the porous silicon indicated the typical $SiO_2$ absorption bands.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. A method of producing a semiconductor structure having dielectrically isolated monocrystalline regions comprising:

a. forming high conductivity regions in a monocrystalline silicon body that surround on the sides and bottoms of monocrystalline silicon regions to be electrically isolated, b. anodically etching the body in a hydrofluoric acid solution to selectively convert the high conductivity monocrystalline silicon regions to regions of porous silicon, and c. oxidizing the resultant porous silicon regions to form silicon oxide regions.

2. The method of claim 1 wherein the anodic etching is adjusted to produce porous silicon regions having an average porosity on the order of 56 percent.

3. The method of claim 1 wherein the semiconductor impurity concentration in the high conductivity regions has a concentration of at least three orders of magnitude greater than the impurity concentration of the surrounding monocrystalline silicon material.

4. The method of claim 1 wherein said high conductivity regions are formed to a shape that surrounds the monocrystalline silicon regions to be isolated on the sides and bottom surfaces.

5. The method of claim 1 wherein the monocrystalline silicon body is formed by epitaxially depositing a layer of silicon on the surface of a monocrystalline silicon wafer substrate.

6. the method of claim 5 wherein said monocrystalline silicon body has a first type impurity embodied in the epitaxial silicon layer, and a second opposite type impurity in the substrate.

7. The method of claim 6 wherein said high conductivity regions are formed of second type impurity, said regions having an impurity concentration of at least three orders of magnitude greater than the impurity concentration of the epitaxial silicon layer.

8. The method of claim 7 wherein said high conductivity regions are formed by a. forming a surface blanket layer region of a second type impurity on the surface of the silicon wafer substrate, b. forming an epitaxial silicon layer over the blanket impurity region incorrporating a first type impurity, and c. forming a grid of impurity regions of a second type impurity in the epitaxial silicon layer that extend into the layer to a depth to merge with the underlying blanket impurity regions.

9. The method of claim 1 wherein device elements are fabricated in the resultant electrically isolated monocrystalline silicon regions.

10. The method of claim 1 wherein the anodic etching of the body is done in an aqueous twelve percent hydrogen fluoride solution maintained at room temperature using a current density in the range of 20 to 60 milliampere/$cm^2$.

11. The method of claim 10 wherein the silicon oxide regions are formed by exposing the porous silicon regions to a steam environment with the substrate heated to a temperature in the range of 800 to 1000°C.

12. The method of claim 1 wherein said high conductivity regions are formed to an annular shape that surround the silicon monocrystalline regions to be isolated, and extends inwardly to a laterally extending PN isolation junction.

13. The method of claim 12 wherein said monocrystalline silicon body is formed by a. forming a plurality of high conductivity subregions of a first type impurity on the surface of a monocrystalline silicon wafer substrate, and b. epitaxially depositing a layer of silicon on the wafer substrate over said high conductivity subregions.

14. The method of claim 13 wherein said high conductivity regions are formed about said high conductivity sub-regions, the high conductivity regions formed of a second type impurity.

15. The method of claim 14 wherein said high conductivity regions include a portion extending over said high conductivity sub-regions.

16. The method of claim 15 wherein said first conductivity type impurity is an N-type impurity, and said second conductivity type impurity is a P-type impurity.

17. The method of claim 7 wherein said first conductivity type impurity is a P-type impurity, and said second conductivity type impurity is an N-type impurity.

* * * * *